(12) United States Patent
Hofrichter et al.

(10) Patent No.: US 12,020,660 B2
(45) Date of Patent: Jun. 25, 2024

(54) ELECTRONIC SENSING DEVICE AND SENSING METHOD

(71) Applicant: ams International AG, Jona (CH)

(72) Inventors: Jens Hofrichter, Horgen (CH); Corneliu-Mihai Tobescu, Wilen B. Wil (CH)

( * ) Notice: Subject to any disclaimer, the term of this patent is extended or adjusted under 35 U.S.C. 154(b) by 0 days.

(21) Appl. No.: 18/041,904

(22) PCT Filed: Aug. 12, 2021

(86) PCT No.: PCT/EP2021/072480
§ 371 (c)(1),
(2) Date: Feb. 16, 2023

(87) PCT Pub. No.: WO2022/038037
PCT Pub. Date: Feb. 24, 2022

(65) Prior Publication Data
US 2023/0326420 A1     Oct. 12, 2023

(30) Foreign Application Priority Data
Aug. 21, 2020   (EP) .................................... 20192160

(51) Int. Cl.
*G09G 3/34*       (2006.01)
*G06V 40/10*      (2022.01)
(Continued)

(52) U.S. Cl.
CPC ....... *G09G 3/3453* (2013.01); *G06V 40/1318* (2022.01); *G06V 40/145* (2022.01);
(Continued)

(58) Field of Classification Search
CPC .......... G09G 3/3453; G09G 2360/142; G09G 2330/028; G09G 3/32; G06V 40/1318; G06V 40/162; G06V 40/15
See application file for complete search history.

(56) References Cited

U.S. PATENT DOCUMENTS 10,437,974 B2    10/2019  He et al.
2009/0256810 A1*  10/2009  Pasquariello ......... G06F 3/0421
                                                    345/173
(Continued)

FOREIGN PATENT DOCUMENTS

GB       2558792 A       7/2018
WO    2013185748 A1    12/2013
WO    2019199693 A1    10/2019

*Primary Examiner* — Abbas I Abdulselam
(74) *Attorney, Agent, or Firm* — MH2 TECHNOLOGY LAW GROUP LLP

(57) ABSTRACT

An electronic sensing device includes a display having a display surface and a plurality of micro light emitters configured to emit light for forming a display image on the display surface. A plurality of micro photodetectors is configured to detect light conditions at the display surface. A transceiver circuit is configured to drive the micro light emitters to emit light, drive the micro photodetectors to detect light and generate photo signals based on the detected light, coordinate the driving of the micro light emitters and of the micro photodetectors, and process the photo signals according to at least one of a list of sensing modes. The plurality of micro light emitters and the plurality of micro photodetectors are arranged on a surface of a display substrate.

16 Claims, 11 Drawing Sheets

(51) Int. Cl.
  *G06V 40/13* (2022.01)
  *G06V 40/145* (2022.01)
  *G06V 40/16* (2022.01)
  *G09G 3/32* (2016.01)
  *H01S 5/183* (2006.01)

(52) U.S. Cl.
  CPC ............ *G06V 40/15* (2022.01); *G06V 40/162* (2022.01); *G09G 3/32* (2013.01); *H01S 5/18305* (2013.01); *G09G 2330/028* (2013.01); *G09G 2360/142* (2013.01); *G09G 2360/144* (2013.01); *G09G 2360/148* (2013.01)

(56) References Cited

U.S. PATENT DOCUMENTS

| | | | |
|---|---|---|---|
| 2015/0146944 A1* | 5/2015 | Pi | G06F 21/32 |
| | | | 382/124 |
| 2017/0220838 A1* | 8/2017 | He | G06F 3/0412 |
| 2017/0337413 A1 | 11/2017 | Bhat et al. | |
| 2019/0198443 A1* | 6/2019 | Nakano | H05K 1/115 |
| 2019/0207135 A1* | 7/2019 | Kristal | H10K 30/10 |
| 2019/0235677 A1 | 8/2019 | Liu et al. | |
| 2019/0278973 A1 | 9/2019 | Setlak et al. | |

* cited by examiner

ELECTRONIC SENSING DEVICE AND SENSING METHOD

CROSS-REFERENCE TO RELATED APPLICATIONS

This patent application is the national stage entry of International Patent Application No. PCT/EP2021/072480, filed on Aug. 12, 2021, and published as WO 2022/038037 A1 on Feb. 24, 2022, and claims priority to European patent application 20192160.8 filed on Aug. 21, 2020, the disclosures of all of which are hereby incorporated by reference in their entireties.

FIELD OF THE INVENTION

The present disclosure relates to an electronic sensing device and to a sensing method.

BACKGROUND OF THE INVENTION

The focus of current developments of flat panel display technologies that are employed in various applications such as mobile devices, wearables, automotive devices and the like lies on manufacturing displays with ever higher pixel densities, improved contrast and better energy efficiency. Modern devices are starting to utilize the emerging micro-LED technology for forming the pixel elements of said displays.

Moreover, the development focus in modern displays also lies on integrating infrared light emitters in order to provide the illumination required for applications, such as proximity sensing and biometric authentication, for instance. These applications are realized by means of employing a separate optical imaging module for sensing reflected light. However, these modules not only require additional space within the device, which can be an extremely limited resource, but integrating separate modules typically results in higher production efforts and costs. To find a compromise between enabling sensing capabilities and providing a cost and space conservative solution, optical imaging capabilities are typically limited to small portions of the display surface.

It is an object of the invention to provide an improved concept of a display and of an electronic sensing device with transceiver capabilities that overcomes the limitations of present day solutions.

These objects are achieved by the subject-matter of the independent claims. Further developments and embodiments are described in the dependent claims.

SUMMARY OF THE INVENTION

The improvements are based on the concept of a micro-LED-based display having integrated sensing elements within the display. The sensing elements can be realized as micro photodiodes that can be fabricated in a similar manner compared to the fabrication of the micro-LEDs. Moreover, the same packaging and assembly process steps can be shared with the micro-LEDs. Combining the functionalities of light emission and light detection in one single device or component such that the display enables much more compact screens for mobile devices featuring various types of sensing capabilities. Thus, the improved concept paves the way for the true seamless integration of emission and sensing elements for next-generation displays for use in, e.g., mobile devices.

In particular, a display according to the improved concept comprises a display substrate, a plurality of pixels, and a plurality of light emitting display subpixels. Each light emitting display subpixel comprises a micro light emitting diode, micro-LED, and is configured to emit light for forming a portion of a display image. The display further comprises a plurality of light capturing subpixels, wherein each light capturing subpixel comprises a micro photodiode and is configured to receive light that is emitted by at least a portion of the light emitting display subpixels and returned via reflection.

The plurality of light emitting display subpixels and the plurality of light capturing subpixels are arranged on a surface of the display substrate. The plurality of light emitting display subpixels and the plurality of light capturing subpixels form the pixels that are distributed across an active display area, or active region, of the display substrate. Furthermore, at least a portion of the pixels comprises a light capturing subpixel and at least one light emitting display subpixel.

The display substrate can be a silicon substrate, e.g. a silicon wafer or a diced chip of a silicon wafer, or a sapphire substrate, comprising functional layers having circuitry for operating the pixels, such as components of a readout circuit and/or a driving circuit, for instance. The display substrate can also be of a different material such as FR4 or polyimide.

For forming a display image, the pixels are composed of light emitting subpixels that are arranged on a surface of the display substrate. For example, each pixel comprises a light emitting subpixel of each of the RGB colors. Therein, each light emitting subpixel comprises a micro-LED. These microscopic LEDs are based on conventional technology, e.g. for forming gallium nitride based LED. However, micro-LEDs are characterized by a much smaller footprint, hence enabling displays with either a higher pixel density or a lower population density of active components on the display layer, i.e. the surface of the display substrate, while maintaining a specific pixel density. The latter aspect allows for the placement of additional active components in the pixel layer of the display, thus allowing for additional functionality and/or a more compact design.

Similar to OLEDs, micro-LEDs offer an enhanced energy efficiency compared to conventional LEDs but also allow for a significantly higher brightness of the emission compared to OLEDs. This enables a near-to-infinite contrast ratio. Moreover, unlike OLEDs, micro-LEDs do not show screen burn-in effects.

The display according to the improved concept further comprises a plurality of light capturing subpixels that are likewise arranged on the surface of the display substrate alongside the micro-LEDs. For example, a portion of the pixels of the display also comprises, besides the aforementioned light emitting subpixels, one or more light capturing subpixels, which is realized by means of micro photodiodes, for instance. The portion of the pixels having a light capturing subpixel define an active region of the display. Active region in this context means that said portion of the display is capable of sensing light incident on the micro photodiodes.

Micro photodiodes are characterized by the same or at least a similar footprint as that of the micro-LEDs and can be fabricated in a similar manner. They comprise an absorbing material, such as silicon, germanium or any other semiconducting material depending on the target absorption wavelength, as well as electrical contacts forming an anode and a cathode for operating the photodiode.

The micro photodiodes are arranged on the display substrate such that they can receive light that is emitted from at least a portion of the micro-LEDs, e.g. from micro-LEDs in the vicinity of the respective micro photodiode, and directed to the micro photodiodes via reflection. The reflection can be of a surface of the display itself, e.g. via internal refection from a display glass, or of an object that is placed on a surface of the display or located above the display. The micro photodiodes can further be configured to receive light that is emitted in an environment of the display, for example for enabling ambient light sensing.

The active region of the display can be a portion of the display area, e.g. half of the display area, or correspond to the entire display area. Within this active region, photo signals generated by the micro photodiodes can be used to realize biometric authentication, such as fingerprint or facial recognition, if a corresponding body part of a user is placed on or above the display within the active region. Therein, light that is emitted by the micro-LEDs can serve as both display image and illumination of the object to be identified and the micro photodiodes can be configured to receive the reflection of said illumination.

In some embodiments, the pixels are arranged in a two-dimensional array within the active display area.

Typically, displays are formed by a two-dimensional side-by-side arrangement of pixels in a matrix on a display substrate. The pixels in turn can likewise be formed as a two-dimensional array of subpixels. For example, the pixels comprise RGB micro-LEDs as light emitting subpixels in a Bayer configuration and pixels within the active region can further comprise an additional light capturing subpixel as a micro photodiode. Alternatively, a light emitting subpixel of pixels within the active region, e.g. a green pixel of a Bayer arrangement, can be sacrificed for a light capturing subpixel, for instance.

In some embodiments, the plurality of light emitting display subpixels comprises infrared emitting display subpixels, wherein each infrared emitting display subpixel comprises an infrared emitter such as an infrared micro-LED or a vertical cavity surface emitting laser, VCSEL.

For applications such as biometric authentication and proximity sensing, the same light used to form the display image can be used as the reflected light sensed by the micro photodiodes. However, illumination of an object in the visible domain can be highly disturbing to a user, particularly in situations in which no or a dark display image is formed by the micro-LEDs. Under these circumstances, these applications can be performed in the infrared domain.

To this end, pixels can in addition comprise light emitting display subpixels that predominantly or exclusively emit light in the infrared domain. These subpixels, like the micro photodiodes, can be effectively regarded as an additional color subpixel added to the RGB emitting subpixels, for instance. For the infrared emitters, both infrared micro-LEDs and VCSELs provide suitable options with a footprint similar or corresponding to that of the micro-LEDs and micro photodiodes. Like the micro photodiodes, the infrared emitters can be added to the pixels of the entire display or to the pixels of the active region, which itself corresponds to a fraction of the display surface or to the entire display surface as described above.

In some embodiments, the plurality of light capturing subpixels comprises infrared capturing display subpixels, wherein each infrared capturing subpixel comprises an infrared detector such as an infrared micro photodiode or a resonant cavity photodetector.

For some applications, it can be desirable to limit a sensitivity of at least a portion of the micro photodiodes to a wavelength range in the infrared domain, such as a wavelength range that corresponds to the emission spectrum of infrared emitters of the display, e.g. a wavelength range around 940 nm. Particularly for authentication applications, this may lead to enhanced performance due to suppression of unwanted background light. The limitation of the micro photodiodes can be achieved by choosing an absorbing material of the photodiode with a corresponding narrow absorption window or alternatively by employing a filter element arranged on the micro photodiode.

In some embodiments, the micro-LEDs comprise an LED base layer and an emission layer arranged on the LED base layer.

The LED base layer may be of a material commonly used in LED technology as LED substrates, such as Si, Ge, GaAs or InP, for instance. The emission layer likewise can be of a material commonly used in LED technology, such as AlN, AlGaN, InGaN, Ge, AlGaInP, InGaAs or the like. An optional buffer layer, such as a GaN buffer, can be arranged in between the LED base layer and the emission layer.

In some embodiments, the micro photodiodes comprise an absorption layer and electrical contacts arranged on the absorption layer.

The photodiode base layer can be of an absorbing material such as Si, AlN, AlGaN, InGaN or AlGaInP, for instance. The electrical contacts are of a conductive material such as a metal and form anode and cathode of the micro photodiode. Optionally, the micro photodiode can comprise further conductive elements such as a TSV or a backside redistribution layer. Moreover, the micro photodiode can comprise a photodiode base layer which may act as a substrate.

In some embodiments, a footprint of the micro-LEDs and of the micro photodiodes is smaller than 0.1 $mm^2$, in particular smaller than 100 $\mu m^2$.

In some embodiments, a footprint of the micro light emitters amounts to 80%-120% of the footprint of the micro photodetectors.

The small footprint of the micro-LEDs and the optional infrared emitters enable a straightforward integration of the micro photodiodes alongside, for example in between, the light emitting subpixels. The small footprint in combination with the integration of the photodiodes into the display itself enables true in-display sensing capabilities without the requirement of providing an additional sensing module that would require additional space when placed underneath the display, for instance. Moreover, by providing a display with micro-LEDs and micro photodiodes according to the improved concept, significantly more compact displays for mobile devices that feature sensing capabilities can be realized.

In some embodiments, the display substrate is a flexible substrate, in particular a polyimide substrate.

The use of flexible substrates significantly reduces the mass of flat panel displays and additionally provides the ability to conform, bend or roll a display into any shape. Moreover, it opens up the possibility of fabricating displays by continuous roll processing, thus providing the basis for cost effective mass production. Flexible polymer substrates, e.g. of polyimide, are characterized by an excellent flexibility, light weight and a low cost.

In some embodiments, the display further comprises a further display substrate that is substantially parallel to the display substrate and arranged on an emission side of the display.

In some further embodiments, the further display substrate is a flexible substrate, in particular a polyimide substrate.

For protection of the micro-LEDs, the micro photodiodes and optional electronics, the display can further comprise a second substrate that is arranged on a side of the subpixels that faces away from the display substrate. Analogous to said first substrate, the further substrate can likewise be a flexible substrate such as a polyimide substrate. For even better protection voids created in between the subpixels and the substrates can be filled with a mold.

In some embodiments, the display further comprises transparent conductors, wherein a transparent conductor is arranged on a side of each of the light emitting display subpixels facing the further display substrate and on a side of each of the light capturing subpixels facing the further display substrate.

For electrically connecting the subpixels, a transparent conductor can be arranged on a side, e.g. an emission side, of the subpixels. For example, indium-tin oxide, ITO, thin films are grown on the emission or absorption side of the subpixels and are thus sandwiched by the subpixels and the further substrate in the finalized device.

In some embodiments, the display further comprises aperture structures that are arranged above at least a portion of the light emitting display subpixels and of the light capturing subpixels on an emission side of the display.

Optical apertures can be employed for limiting the receiving or emission angle of the subpixels in order to prevent unwanted light from being sensed by the micro photodiodes, for instance. The optical apertures can be realized by means of an optical spacer layer that comprises light absorbing material defining an optical aperture above the micro-LEDs and/or the micro photodiodes.

In some embodiments, the display further comprises lens structures that are arranged above at least a portion of the light emitting display subpixels and of the light capturing subpixels on an emission side of the display.

The employment of micro-LEDs and micro photodiodes means smaller footprints of said elements compared to those used in conventional LED or LCD displays. However, vast empty space between subpixels and/or pixels, e.g. when arranging other circuitry on the display substrate in between the pixels and subpixels, can lead to a non-continuous display image. To circumvent this, lens elements can be arranged above the subpixels for ensuring that the entire display surface is illuminated when forming a display image. Likewise, lens elements can be employed to more efficiently capture light with the micro photodiodes.

In some embodiments, the plurality of light emitting display subpixels and the plurality of light capturing subpixels are configured to be driven by a transceiver element, in particular by a single transceiver element.

For example, the display comprises a transceiver circuit, e.g. a transceiver integrated circuit, which is configured to drive the micro-LEDs to emit light and the micro photodiodes to receive light or to generate a photocurrent based on received light. The transceiver element can alternatively be a separate module that is coupled to the display.

A single element, e.g. realized as a transceiver chip, that drives both the LEDs as well as measure the response of the micro photodiodes largely simplifies synchronization of emission and detection and additionally saves valuable real estate on the product. Moreover, this reduces cost significantly.

In some embodiments, the plurality of light emitting display subpixels and the plurality of light capturing subpixels are configured to be driven in a synchronized manner.

The micro photodiodes are driven to receive light or to generate a photocurrent based on received light when at least a portion of the micro-LEDs are switched on, i.e. emit light. For instance, the micro photodiodes are operated when infrared emitting micro-LEDs are driven to emit light while emission of micro-LEDs that emit light in the visible domain is disabled.

For example, a transceiver circuit that is part of the display or a separate element and is configured to drive the micro-LEDs to emit light and the micro photodiodes to receive light or to generate a photocurrent based on received light realizes the synchronized drive in the described manner.

The object is further solved by a method for manufacturing a display. The method comprises providing a display substrate, and forming light-emitting display subpixels by arranging a plurality of micro light emitting diodes, micro-LEDs, on a surface of the display substrate. The method further comprises forming light capturing subpixels by arranging a plurality of micro photodiodes on the surface of the display substrate. The plurality of light emitting display subpixels and the plurality of light capturing subpixels form pixels that are distributed across an active display area of the display substrate. Moreover, at least a portion of the pixels comprises a light capturing subpixel and at least one light emitting display subpixel.

In some embodiments of the method, forming the light emitting display subpixels comprises forming the plurality of micro-LEDs on a donor substrate, and transferring the plurality of micro-LEDs from the donor substrate to the surface of the display substrate via mass transfer. In these embodiments of the method, forming the light capturing subpixels comprises forming the plurality of micro photodiodes on a further donor substrate, and transferring the plurality of micro photodiodes from the further donor substrate to the surface of the display substrate via mass transfer.

The micro-LEDs and the micro photodiodes can be fabricated on a respective donor substrate according to their respective manufacturing process and then be transferred to the display substrate via mass transfer. For example, the transfer operates in accordance with the electrostatic principle. This process consists of picking up an array of micro-LEDs from the donor substrate with an array of electrostatic transfer heads, transferring heat from the head and liquefying a bonding layer on the receiving display substrate, and bonding the micro-LED array to the display substrate before releasing them. Another example of a mass transfer process is an elastomer stamp process, in which a soft elastomeric stamp is brought into contact with the micro-LEDs. With a sufficiently high peel velocity, the micro-LEDs are attached onto the stamp and lifted away from the donor substrate. With a sufficiently low peel velocity, the micro-LEDs are released from the stamp and adhered to the display substrate. The transfer of the micro photodiodes in both exemplary mass transfer processes is performed in an analogous manner.

Alternatively to the mass transfer, the micro lens and the micro photodiodes can be directly fabricated on the display substrate. This can facilitate the manufacturing process if the micro-LEDs and the micro photodiodes are based on the same or at least compatible materials regarding the fabrication process.

Further embodiments of the method become apparent to the skilled reader from the embodiments of the display described above.

The object is further solved by an electronic sensing device that comprises a display having a display surface and a plurality of micro light emitters that are configured to emit light for forming a display image on the display surface. The electronic sensing device further comprises a plurality of micro photodetectors that are configured to detect the light conditions at the display surface, and a transceiver circuit. The transceiver circuit is configured to drive the micro light emitters to emit light, drive the micro photodetectors to detect light and generate photo signals based on the detected light, coordinate the driving of the micro light emitters and of the micro photodetectors, and process the photo signals according to at least one of a list of sensing modes. The plurality of micro light emitters and the plurality of micro photodetectors are arranged on a surface of a display substrate.

The electronic sensing device can be a mobile device such as a smartphone, a wearable or a computer employed in an automotive, for instance. The electronic sensing device can alternatively be a component, e.g. a touchscreen device, of one of the aforementioned devices.

For forming the display image, the display comprises micro light emitters, such as micro-LEDs. For example, pixels of the display comprise subpixels that each have a micro light emitter. In particular, each pixel can comprise emitters for each of the RGB colors. In addition to the micro light emitters, at least a portion of the pixels further comprises a micro photodetector for detecting light and generating a photo signal based on the detected light. The micro photodetectors can be micro photodiodes, for instance. Alternatively, the micro photodetectors can be realized by means of reversed biased micro-LEDs, for example via applying a reverse bias voltage to the micro light emitters. According to the improved concept, the micro photodetectors are arranged alongside the micro light emitters on a surface of a display substrate. The pixels comprising micro photodetectors define an active region of the display, which can correspond to a fraction or to the entire display.

The electronic sensing device is configured to act as a transceiver by comprising a transceiver circuit that controls both the micro light emitters and the micro photodetectors. Besides driving the micro light emitters to form the display image, the transceiver circuit is configured to also drive the micro light emitters for illumination purposes. For example, an object that is located on or above a surface of the sensing device, e.g. the display surface, is illuminated.

Furthermore, the transceiver circuit is configured to drive the micro photodetectors. Driving the photodetectors in this context means that photo signals generated by light that is incident on the photodetectors are read out, for instance. The detected light can either be light that is emitted by the light emitters and directed to the photodetectors by reflection, or it is light that is emitted in an environment of the sensing device, e.g. ambient light. In particular, the transceiver circuit operates the electronic sensing device in a transceiver mode by operating the micro light emitters during an illumination time and operating the micro photodetectors during a detection time that coincides with or follows the illumination time. For example, the transceiver circuit synchronizes the drive of the micro light emitters and the drive of the micro photodetectors.

The transceiver circuit is further configured to process the photo signals according to one of a list of sensing modes. For example, processing the photo signals comprises comparing the photo signals or signals derived from the photo signals to reference data. Processing the photo signals can also or alternatively comprise determining a measurement value such as light intensity, brightness, spectral composition or a quantity derived from one of these, for instance.

In some embodiments, the list of sensing modes comprises at least one of: a biometric authentication mode, a proximity sensing mode, an ambient light sensing mode, and a battery support mode.

In some further embodiments, in the biometric authentication mode and in the proximity sensing mode, the plurality of micro photodetectors is configured to sense light that is emitted by at least a portion of the micro light emitters and is reflected from an interface that is defined by a user's body part located on or above the display surface.

The biometric authentication mode realizes the identification of a body part of a user of the sensing device for authentication purposes, such as an unlocking or a log in into the device. The proximity sensing mode determines a value that corresponds to a distance of an object, e.g. a body part, with respect to the display. In these sensing modes, the transceiver circuit controls the micro light emitters to emit light that impinges on the interface formed by the body part that is located on or above the display within its active region, and this reflected towards the micro photodetectors. The transceiver circuit further controls the micro photodetectors to detect said reflected light and to perform a recognition process based on the photo signals generated by the micro photodetectors. The interface can be formed by a transition between a cover glass and the object, or by a transition between air and the object. Hence, with the display itself enabling biometric authentication, an additional light sensor module that is separate from the display is no longer required.

In some further embodiments, the user's body part is a face or a finger.

Biometric authentication is typically performed on a body part that has a unique characteristic with respect to the user. The body part can be a finger or fingerprint, the palm of a hand, or the face of the user.

In some further embodiments, the interface is defined by a blood vessel structure and/or by a sweat channel structure of the body part.

Alternatively or in addition to the interface being formed by a surface of the body part, and interface can likewise be formed within the body part by a transition that is defined by blood vessel structures or sweat channels. For biometric authentication, identifying functioning blood vessels or sweat channels can be used to confirm whether a live object, i.e. an actual living body part of a user, is being illuminated. Furthermore, biomedical measurements, such as a pulse measurement, can be performed. To this end, infrared illumination by means of the micro light emitters can be employed that penetrates skin sufficiently deep.

In some embodiments of the electronic sensing device, in the biometric authentication mode, the transceiver circuit for processing the photo signals is configured to perform a biometric authentication, in particular fingerprint or facial recognition, of the body part based on the photo signals and on reference biometric data stored in a memory of the electronic sensing device.

The transceiver circuit can comprise or be connected to a memory module, in which reference biometric data is stored for performing the actual authentication process. Exact methods to analyze the photo signals and to perform the authentication process is a well-known concept and thus not further detailed in this disclosure.

In some embodiments, in the proximity sensing mode, the transceiver circuit for processing the photo signals is configured to determine a distance from the interface.

The proximity sensing mode can be performed for determining the distance to a hand or a finger of a user, for instance.

This way, the display can be configured to light up in case the user's body part is within a certain threshold distance from the display surface. Also, touch input of a touchscreen can be activated only under the circumstances. Hence, an additional dedicated proximity sensor is no longer required.

In some embodiments, in the ambient light sensing mode and in the solar cell mode, the plurality of micro photodetectors is configured to sense light that is emitted in an environment of the electronic sensing device.

In addition to receiving reflected light from the micro light emitters, the micro photodetectors can be configured to sense light in an environment up to sensing device such as ambient light for determining lighting conditions. This information can be used in turn to adjust a brightness of the display image, i.e. an emission intensity of the micro light emitters. Hence, an additional dedicated ambient light sensor is no longer required.

In some further embodiments, in the ambient light sensing mode, the transceiver circuit for processing the photo signals is configured to determine characteristics of the light emitted in the environment, in particular brightness, color temperature and/or spectral composition.

In some further embodiments, in the battery support mode, the transceiver circuit for processing the photo signals is configured to provide at least a portion of the photo signals to the electronic sensing device as a power source.

The battery support mode can realize a solar panel function and thus act as an additional power supply for supporting a battery of the device. To this end, photo signals generated by the photodetectors can directly be supplied to the device or a component of the device.

At least some of the described sensing modes can work in conjunction with one another. For example, ambient light sensing and battery support can be performed concurrently. Likewise, a biometric authentication can be performed in parallel to proximity sensing.

In some embodiments, the plurality of micro light emitters comprises micro infrared emitters such as infrared micro-LEDs or vertical cavity surface emitting lasers, VCSELS.

As described above, for some applications it can be desirable to perform emission and/or detection of light in the infrared domain. For example, a biometric authentication or proximity sensing can be performed in the infrared domain when no display image is formed without disturbing the user. Moreover, the performance of some sensing modes can benefit from a limited wavelength range in the infrared. For example, illumination and detection can be limited to a wavelength range around 940 nm, at which biometric authentication can be reliably performed with typically low influence of background light.

The object is further solved by a sensing method using a device with a display having a display surface and a display substrate. The method comprises emitting light by means of a plurality of micro light emitters that are arranged on a surface of the display substrate for forming a display image on the display surface. The method further comprises sensing light conditions at the display surface by means of a plurality of micro photodetectors that are arranged on the surface of the display substrate. The method further comprises reading out, by means of a transceiver circuit, photo signals that are generated by the micro photodetectors based on sensed light. The method further comprises coordinating, by means of the transceiver circuit, driving of the micro light emitters and of the micro photodetectors, and processing the photo signals according to at least one of a list of sensing modes.

Further embodiments of the sensing method according to the improved concept become apparent to a person skilled in the art from the embodiments of the electronic sensing device described above.

BRIEF DESCRIPTION OF THE DRAWINGS

The following description of figures of exemplary embodiments may further illustrate and explain aspects of the improved concept. Components and parts with the same structure and the same effect, respectively, appear with equivalent reference symbols. Insofar as components and parts correspond to one another in terms of their function in different figures, the description thereof is not necessarily repeated for each of the following figures.

In the Figures.

DETAILED DESCRIPTION

Figure 1:
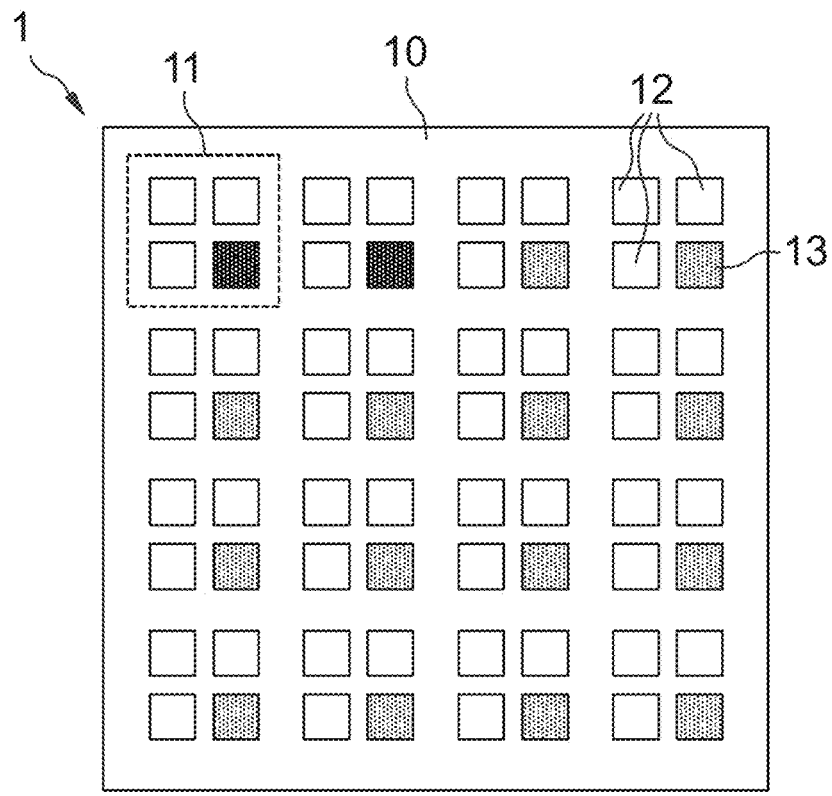
FIGS. 1 to 11 show exemplary embodiments of a display according to the improved concept.

FIG. 1 shows a schematic top view of an exemplary embodiment of a display 1 according to the improved concept. The display 1 comprises a display substrate 10 having a surface on which pixels 11 are arranged. The pixels 11 are formed by groups of light emitting subpixels, each comprising a micro light emitter 12, and light capturing subpixels, each comprising a micro photodetector 13. In the embodiments illustrated in FIGS. 1 to 11, the micro light emitters are realized as micro-LEDs and the micro photodetectors are realized as micro photodiodes. However, alternative solutions, e.g. based on VCSELs as emitters and reverse-biased LEDs as detectors are likely conceivable.

The display substrate 10 can be a flexible substrate made of polyimide or a FR4 substrate. Likewise, the display substrate 10 can be a silicon substrate, e.g. a wafer or part of a wafer. The display substrate 10 itself can comprise multiple layers such as buffering and function layers.

The pixels 11 in this embodiment comprise three micro-LEDs 12, for example of each of the RGB colors, for forming a display image, and a single micro photodiode 13. However, different compositions of the pixels 11 are not excluded and can depend on the specific application. Moreover, not all pixels 11 of the display 1 necessarily have the same composition of subpixels. For example, only pixels 11 within an active region of the display 1 comprise a micro photodiode 13. However, the active region can correspond to the entire display surface of the display 1.

It is particularly emphasized that the schematics in this and in the following figures merely serve an illustrational purpose. Actual displays 1 may vary in terms of the exact subpixel arrangement as well as in terms of dimensions and density.

Figure 2:
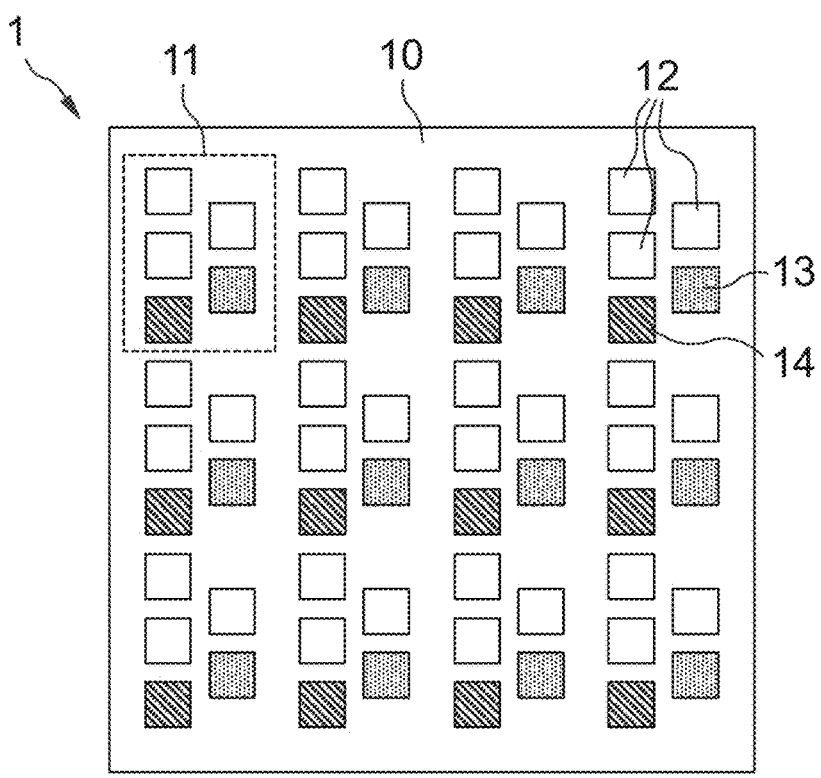

FIG. 2 shows a schematic top view of a further exemplary embodiment of a display 1 that is similar to that illustrated in FIG. 1. Compared to FIG. 1, this embodiment is characterized by the pixels 11 in the active region of the display 1 further comprising an infrared emitter 14. The infrared emitter 14 exclusively or predominantly emits light in the infrared domain and can be realized by an infrared micro-LED or alternatively by a VCSEL. Hence, in this exemplary embodiment, each pixel 11 is composed of three micro-LEDs 12 that have an emission in the visible domain, a micro photodiode 13 that is sensitive to infrared and optionally to visible light, and the infrared emitter 14.

However, also in embodiments having such an infrared emitter 14, various compositions of the individual pixels 11 and arrangement of the subpixels can be adjusted to the specific application requirements.

Figure 3:
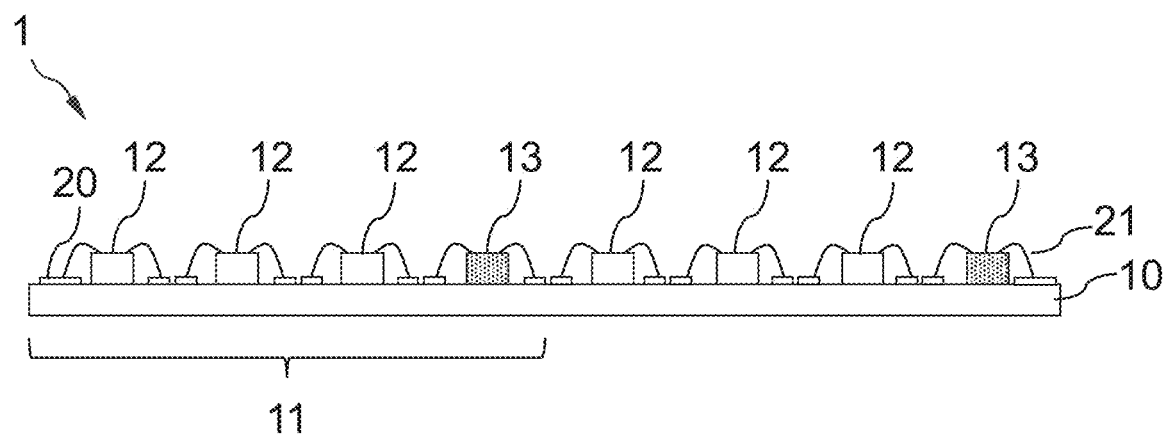

FIG. 3 shows a schematic cross-sectional view of an exemplary embodiment of a display 1 according to the improved concept. In this view, it is illustrated that the display 1 further comprises conductors 20 and wiring elements 21 for electrically connecting the subpixels, e.g. anode and cathode of the subpixels, to an electric circuit, for instance. For example, each pixel 11 comprises circuitry to drive the micro-LEDs 12 and to read out the micro photodiode 13. The circuitry can be arranged on all within a functional layer of the display substrate 10, for instance.

Figure 4:
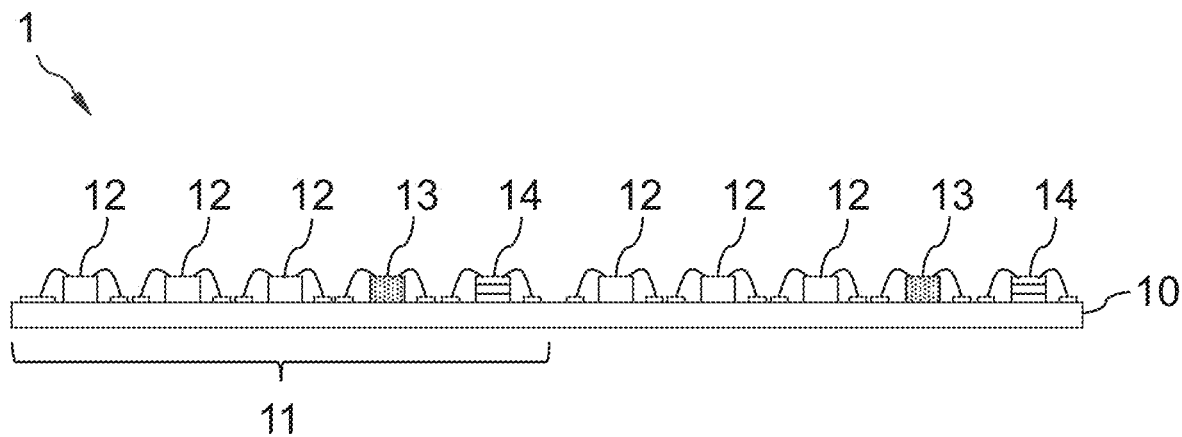

FIG. 4 shows a schematic cross-sectional view of a further exemplary embodiment of a display 1 that is similar to that illustrated in FIG. 3. Compared to FIG. 3 and similar to FIG. 2, the schematic shows pixels 11 that additionally comprise an infrared emitter 14, which for example is realized by a VCSEL.

Figure 5:
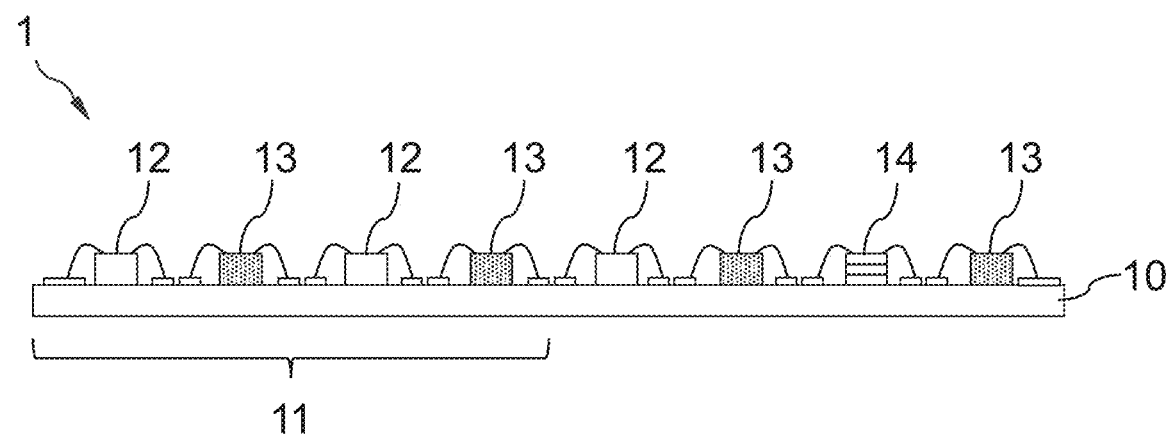

FIG. 5 shows a schematic cross-sectional view of a further exemplary embodiment of a display 1 similar to that illustrated in FIGS. 3 and 4, however, wherein a micro photodiode 13 is arranged alongside each of the micro-LEDs 12 and the optional infrared emitter 14. Such an arrangement has the advantage of realizing a resolution of the image sensing that corresponds to the resolution of the display image formed by the micro-LEDs 12. Again, such an arrangement can be limited to an active region of the display 1, which can be a fraction of or extend across the entire display surface.

Figure 6:
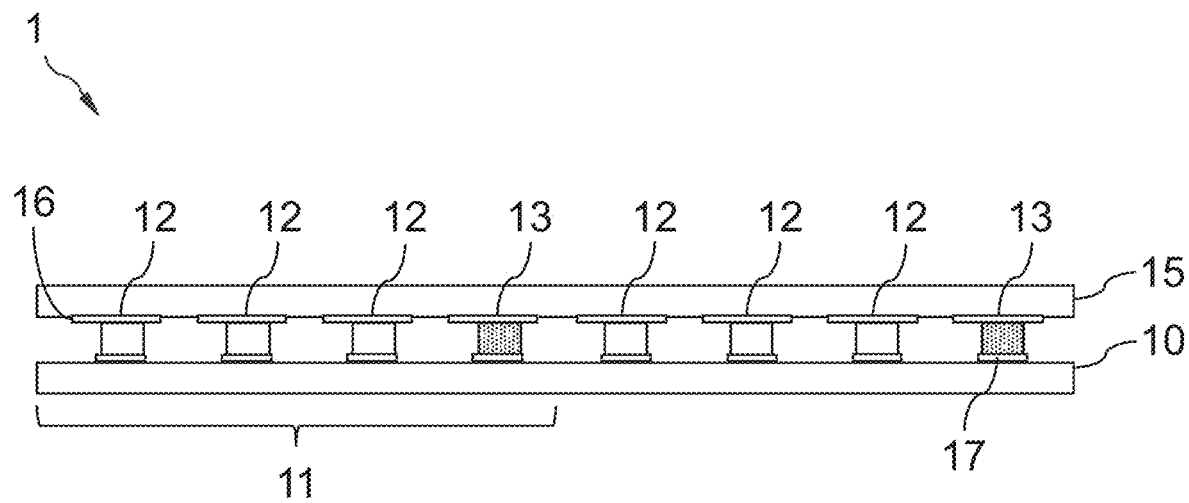

FIG. 6 shows a schematic cross-sectional view of a further embodiment of the display 1. In this embodiment, a further display substrate 15 is arranged on a side of the subpixels that is facing away from the display substrate 10. In other words, the display substrate 10, the pixels 11 and the further substrate 15 form a sandwich structure. In this embodiment, the micro-LEDs 12, the micro photodiodes 13 and optional infrared metrics 14 not shown are bonded to the display substrate 10 by means of connection elements 17, e.g. solder pads. The connection elements 17 can be electrically conductive and contact an electrical contact of the respective subpixel to a contact pad on the surface of the display substrate 10.

On the side of the subpixels that faces the further substrate 15, which can be referred to the admission or absorption side of the subpixels, transparent conductors 16 are arranged for providing a further electrical contact. For example, the transparent conductors 16 are realized by indium-tin oxide, ITO, thin films that are grown on the emission or absorption side of the subpixels.

The further display substrate 15 can be a flexible substrate, such as a polyimide substrate, particularly in embodiments in which the display substrate 10 is a flexible substrate. The further display substrate 15 can alternatively be a glass substrate forming the display glass in which the display image is formed, for instance.

Figure 7:
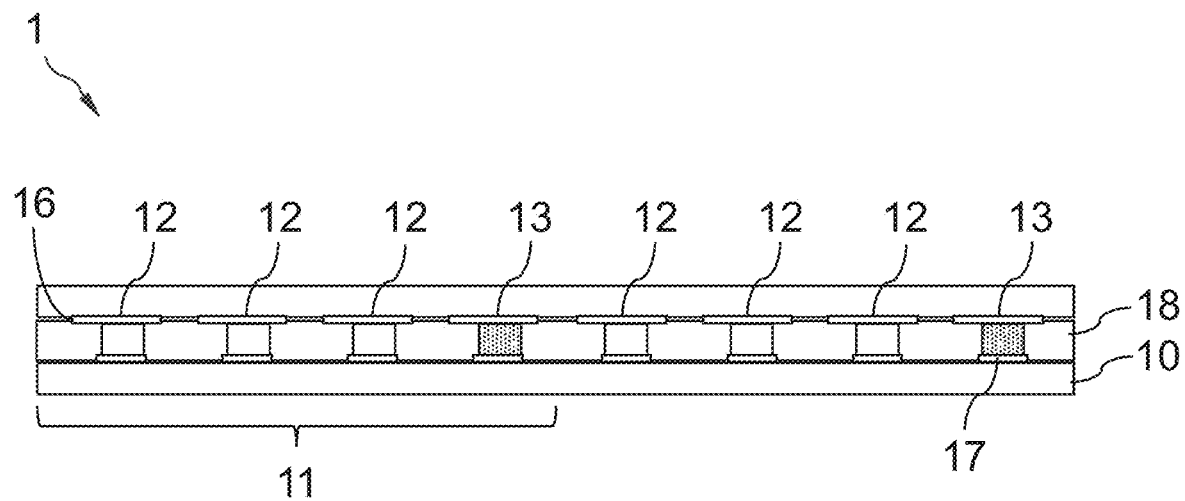

FIG. 7 shows a schematic cross-sectional view of a further embodiment of the display 1 similar to that of FIG. 6. Compared to the previous embodiment, this embodiment additionally features a mold 18. The mold 18 may serve as a protection for active circuitry and the subpixels as well as providing stability to the display 1. For example, the mold is of a semiconducting material such as an oxide, e.g. silicon dioxide.

Figure 8:
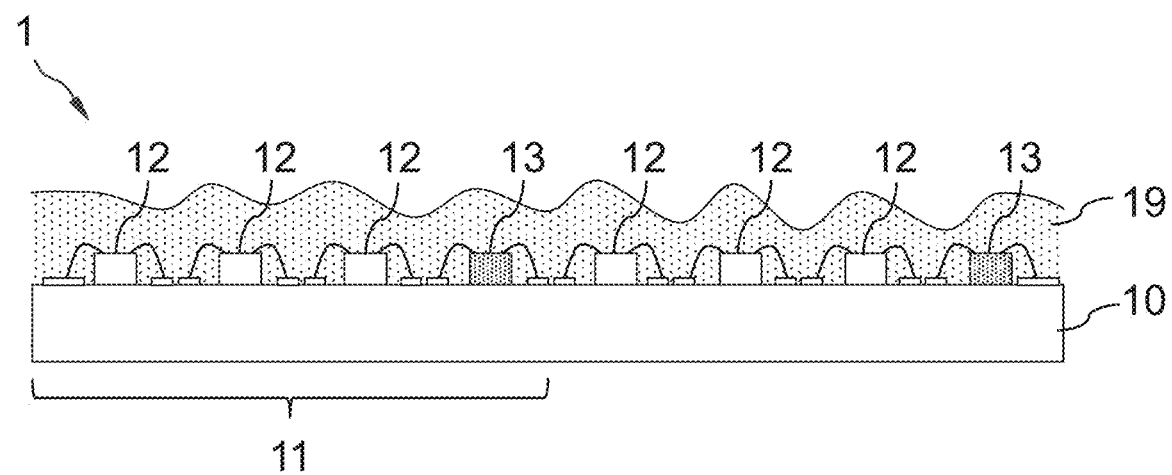

FIG. 8 shows a schematic cross-sectional view of a further embodiment of the display 1. In this embodiment, the micro-LEDs 12, the micro photodiodes 13 and the optional infrared emitter is 14 not shown are embedded within a clear mold 19. The clear mold 19 may serve as a protection for active circuitry and for the subpixels. For example, the clear mold 19 is of a material such as an epoxy, silicone or the like. A top surface of the clear mold 19 can be smooth or possess a topography due to the topography of the micro-LEDs, as exaggeratingly illustrated in the figure.

Figure 9:
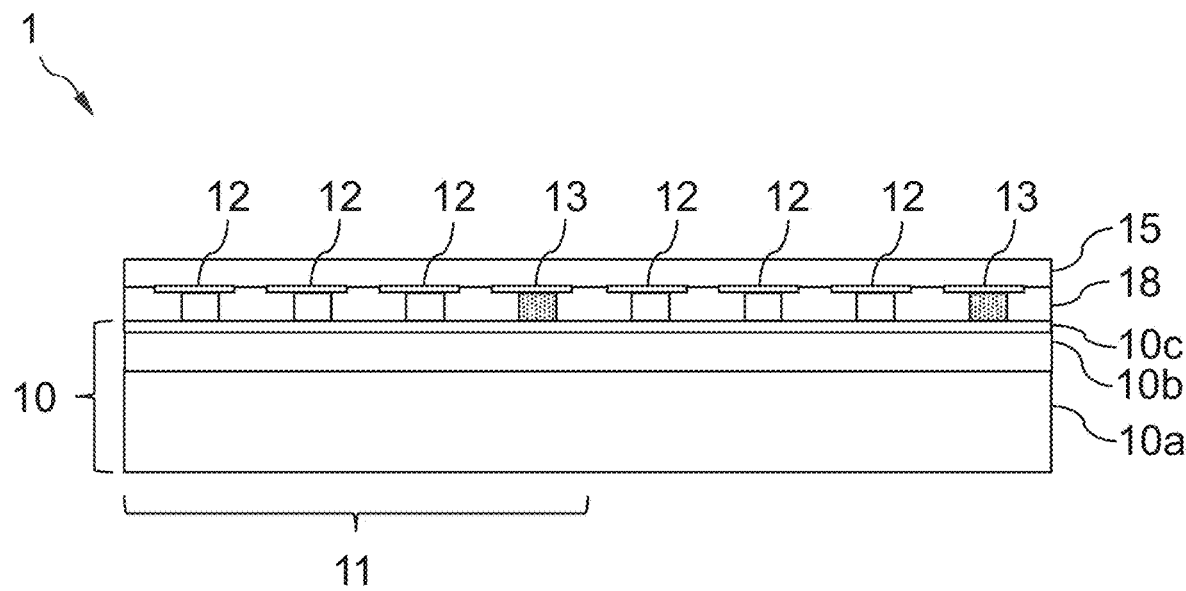

FIG. 9 shows a schematic cross-sectional view of a further embodiment of the display 1 similar to that illustrated in FIG. 6. In this embodiment, the display substrate 10 comprises a semiconductor substrate 10a, e.g. a silicon wafer or a diced portion of the city can wafer, a buffer layer 10b, such as a gallium nitride buffer layer, and a conductive layer 10c, for example being characterized by a specific doping. The display substrate 10 in its function layers can comprise active and passive circuitry necessary to address, i.e. drive and read out, the individual subpixels of each pixel 11.

Figure 10:
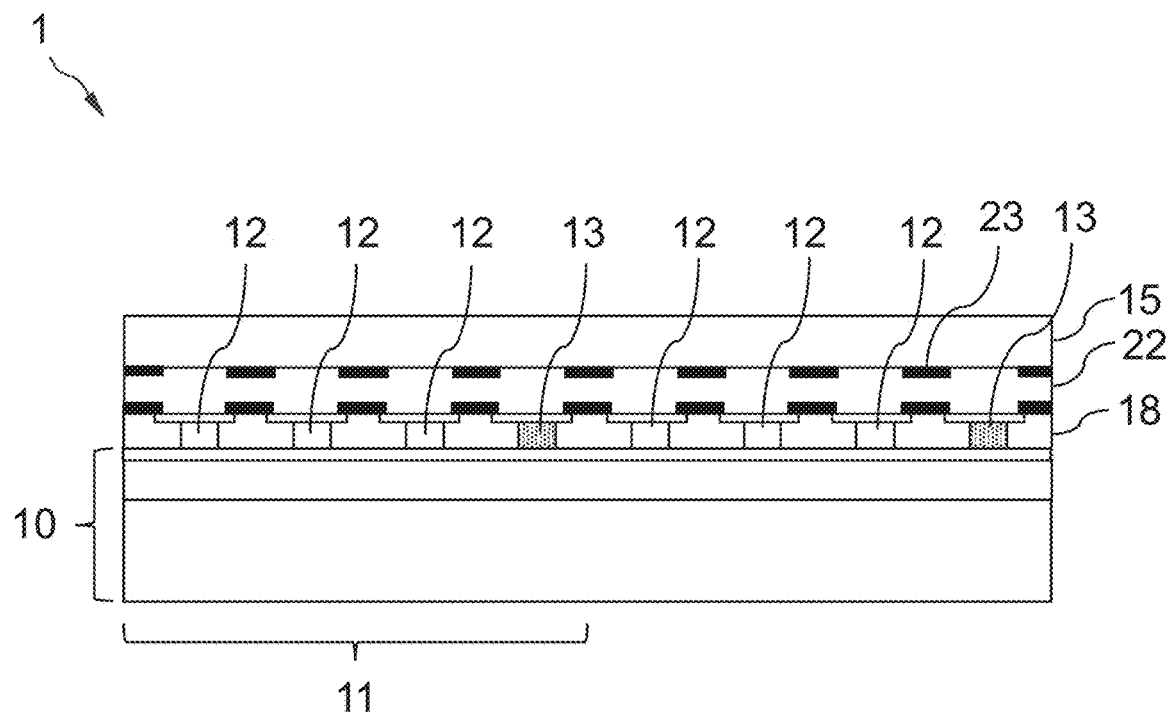

FIG. 10 shows a schematic cross-sectional view of a further embodiment of the display 1 that is based on the embodiment shown in FIG. 9. The embodiment of FIG. 10 in comparison to the previous embodiment additionally comprises an optical spacer layer 22 that is arranged on an emission or absorption side of the subpixels and in between the subpixels and the further display substrate 15, which may be a glass plate or a flexible substrate, such as a polyimide substrate as described above.

The optical spacer layer 22 comprises absorbing elements 23 that are arranged such that an optical aperture is formed above the micro-LEDs 12, the micro photodiodes 13 and the optional infrared emitters 14. Therein, the absorbing elements 23 can be limited to the active region of the display 1, i.e. the portion of the display 1 that comprises pixels 11 having micro photodiodes 13. The formed optical apertures limit the incident angle of light that can be received by the micro photodiodes 13 and the emission angle of light emitted by the micro-LEDs 12 and the optional infrared emitters 14. The optical spacer layer 22 is of an optically transparent material, such as an oxide, while the absorbing elements 23 are of an optically opaque material, such as a metal.

Figure 11:
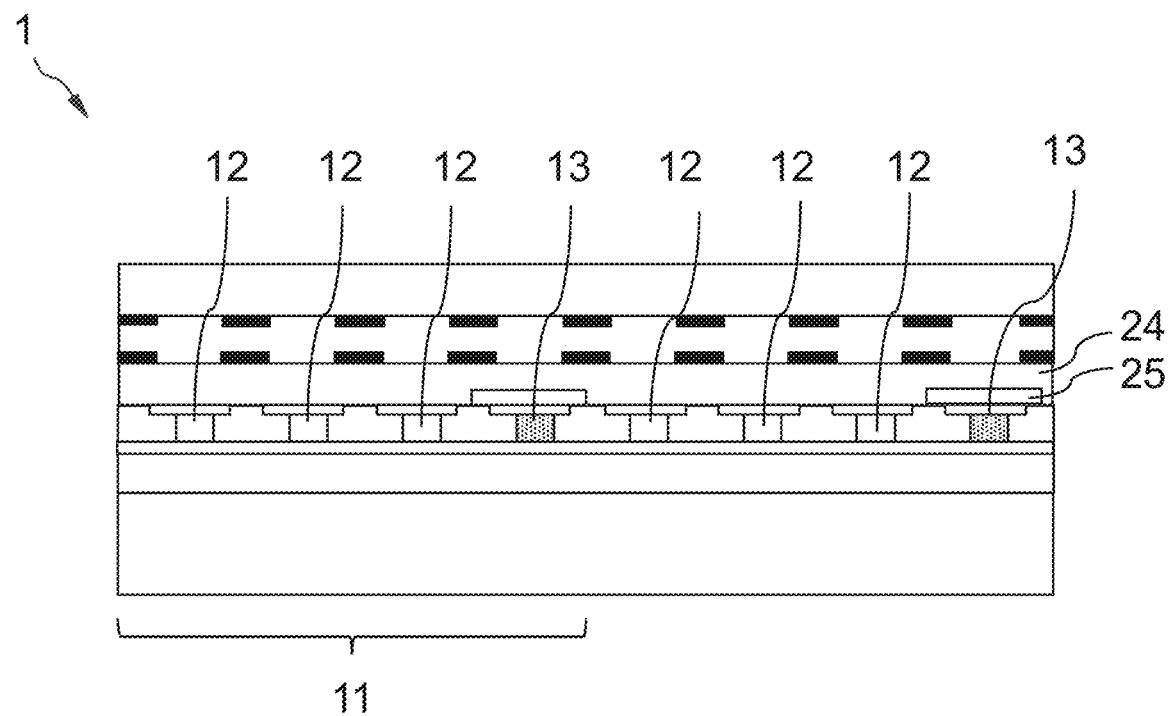

FIG. 11 shows a schematic cross-sectional view of a further embodiment of the display 1 that is based on the embodiment illustrated in the previous FIG. 10. In addition to the previous embodiment, the embodiment of FIG. 11 comprises a filter substrate 24 that is arranged on an emission or absorption side of the subpixels hand in between the subpixels and the optical spacer layer 22.

The filter substrate 24 comprises filter elements 25 that are arranged above the micro photodiodes 13 such that any incident light has to traverse a filter element 24 before entering and absorption material of the respective micro photodiode 13. For example, the filter elements 25 are infrared filters that are predominantly or exclusively transmissive for infrared light. It is emphasized that embodiments comprising a filter substrate 24 with filter elements 25 without an optical spacer layer 22 can also be provided.

Figure 12:
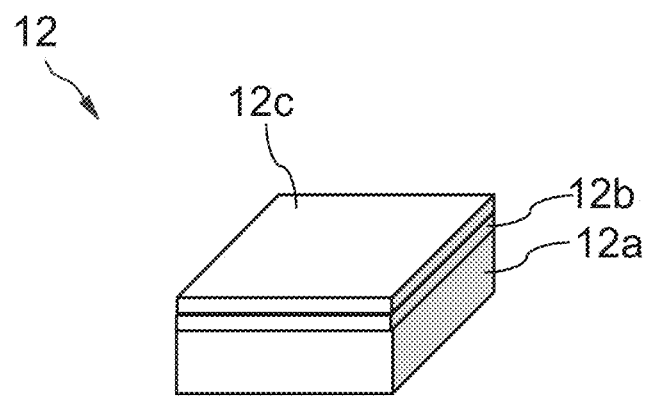
FIG. 12 shows an embodiment of a micro-LED employed in a display according to the improved concept.

FIG. 12 shows a schematic view of an exemplary embodiment of a micro-LED 12 employed as a light emitter in a display 1 according to the improved concept. The micro-LED 12 comprises a base layer 12*a* on which a buffer layer 12*b* is arranged. On the buffer layer 12*b*, facing away from the base layer 12*a*, an emission layer 12*c* is arranged.

The base layer 12*a* is for example an LED substrate made of silicon, while the buffer layer 12*b* is a gallium nitride buffer, for instance. The emission layer 12*c* can be of aluminum nitride, aluminum gallium nitride, indium gallium nitride. Alternative embodiments of the micro-LED 12 can consist of merely one or two layers. For example, a micro-LED 12 can consist of a germanium layer arranged on a silicon base layer, an aluminum gallium indium phosphide layer arranged on a gallium arsenide base layer, or an indium gallium arsenide layer arranged on an indium phosphide base layer. Moreover, also micro-LEDs 12 consisting of merely a germanium or gallium arsenide emission layer are possible. In general, for the micro-LED technology, the same possibilities as in the common LED technology apply.

The micro-LEDs 12 employed in a display 1 according to the improved concept are characterized by a footprint smaller than 0.1 mm$^2$, in particular smaller than 100 μm$^2$. For example, the micro-LEDs 12 are characterized by a rectangular or square footprint with a side length of 30 μm or less. The same applies to the micro photodiodes 13.

Figure 13:
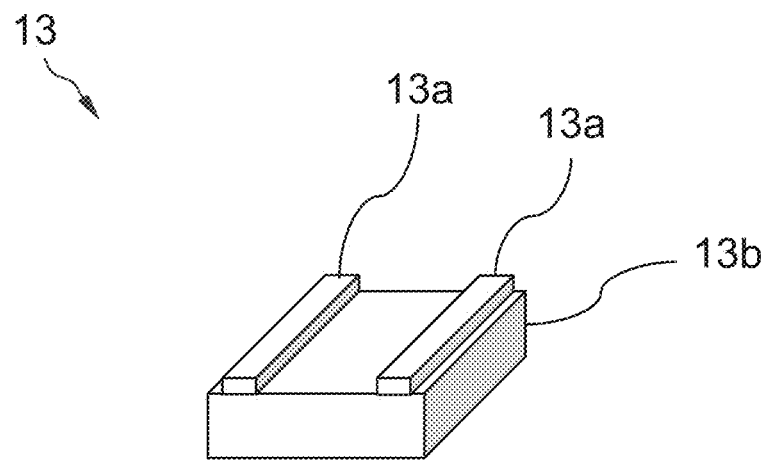
FIGS. 13 to 15 show embodiments of a micro photodiode employed in a display according to the improved concept.
Figure 14:
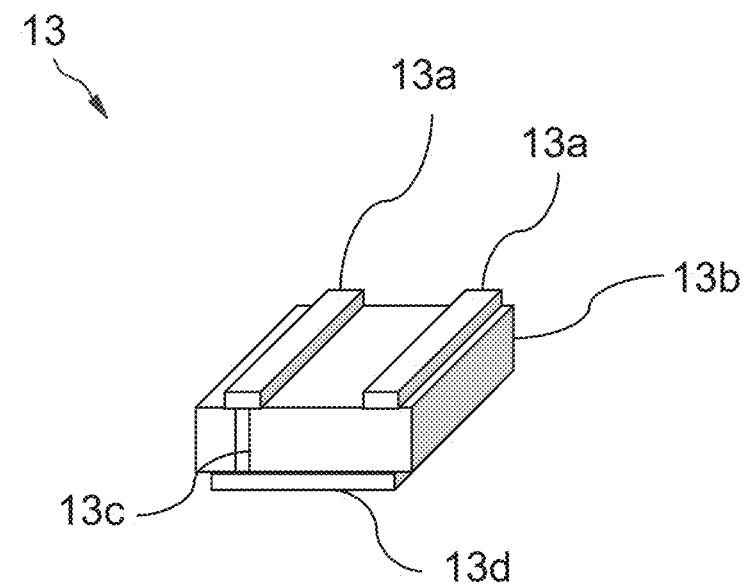
Figure 15:
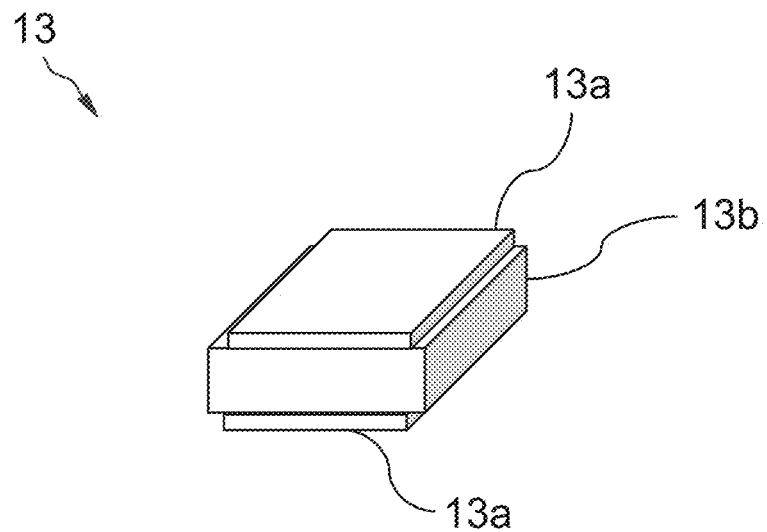

FIGS. 13 to 15 show schematic views of exemplary embodiments of a micro photodiode 13 employed in a display 1 according to the improved concept for capturing light. The micro photodiode 13 comprises electrical contacts 13*a*, e.g. an anode and a cathode, and an absorbing material 13*b*. Depending on requirements of the specific application, the electrical contacts 13*a* can be arranged in various manners.

For example, two electrical contacts 13*a* can be arranged on a top surface of the absorbing material 13*b*, as shown in FIG. 13, for forming an anode and cathode that can be connected to contacts of an integrated circuit via wiring elements 21, for instance. Alternatively, as shown in FIG. 15, the electrical contacts 13*a* and the absorbing material 13*b* can form a sandwich structure. Therein, an electrical contact 13*a* on a backside of the micro photodiode 13 can be directly bonded, e.g. soldered, to a contact pad of an integrated circuit, which is arranged on or within the display substrate 10, for instance.

FIG. 14 shows yet an alternative embodiment of a micro photodiode 13 similar to the embodiment of FIG. 13, further comprising a through-silicon via 13*c*, TSV, e.g. for interconnecting one of the electrical contacts 13*a* to a backside redistribution layer 13*d*, for instance. The backside redistribution layer 13*d* on a backside of the micro photodiode 13 can be directly bonded, e.g. soldered, to a contact pad of an integrated circuit.

Figure 16:
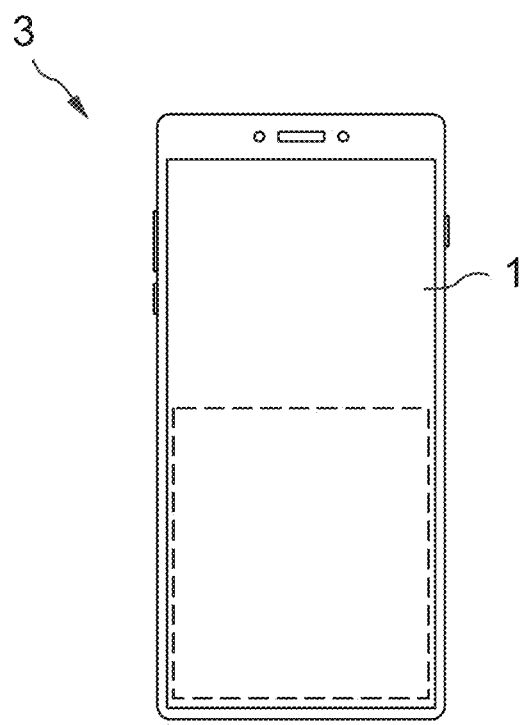
FIG. 16 shows an exemplary embodiment of a mobile device having a display according to the improved concept.

FIG. 16 shows an exemplary embodiment of a mobile device 3 that comprises a display 1 according to the improved concept. An active region of the display, comprising pixels 11 with one or more micro photodiodes 13, can occupy a fraction of the display surface, e.g. the bottom half as indicated as the dashed region in FIG. 3, but can also corresponds to the entire display surface.

Alternatively, a display 1 according to the improved concept can likewise be employed in other devices, such as portable computers, wearables, and computers, such as the infotainment system in a car.

Figure 17:
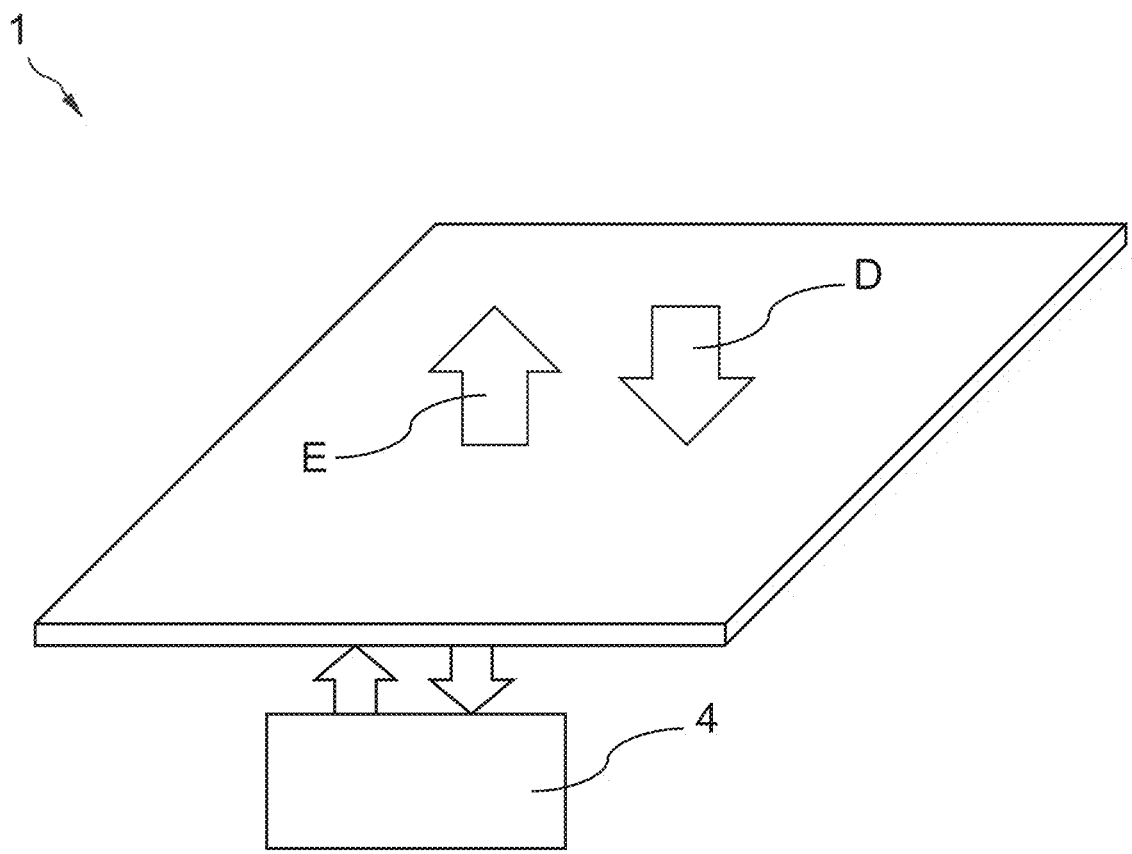
FIG. 17 shows a further exemplary embodiment of a display according to the improved concept.

FIG. 17 shows a further exemplary embodiment of a display 1 according to the improved concept. In this embodiment, the display 1 further comprises a transceiver element 4, e.g. a transceiver integrated circuit, which is configured to drive the plurality of light emitting display subpixels and the plurality of light capturing subpixels. In particular, the transceiver element 4 is configured to drive the micro-LEDs 12 to emit light and to drive the micro photodiodes 13, i.e. to read out photocurrents generated by received light. In the Figure, the drive of the transceiver element 4 to emit light as well as the emission of light E is indicated as arrows pointing upwards, while detected light D as well as the drive of the transceiver element 4 to read out photocurrents from the micro photodiodes 13 is indicated as arrows pointing downwards.

The transceiver element 4 can be configured to drive the micro-LEDs 12 and the micro photodiodes 13 in a synchronized manner. For example, the transceiver element 4 can be configured to read out signals from the micro photodiodes 13 while a portion of the micro-LEDs 12, e.g. infrared emitting micro-LEDs within an active area of the display 1, is driven to emit light while an emission of the remaining micro-LEDs, e.g. micro-LEDs that emit light in the visible domain, is disabled. In alternative embodiments, the transceiver element 4 can be a separate element, such as a module or a chip, which is coupled to the display 1.

Figure 18:
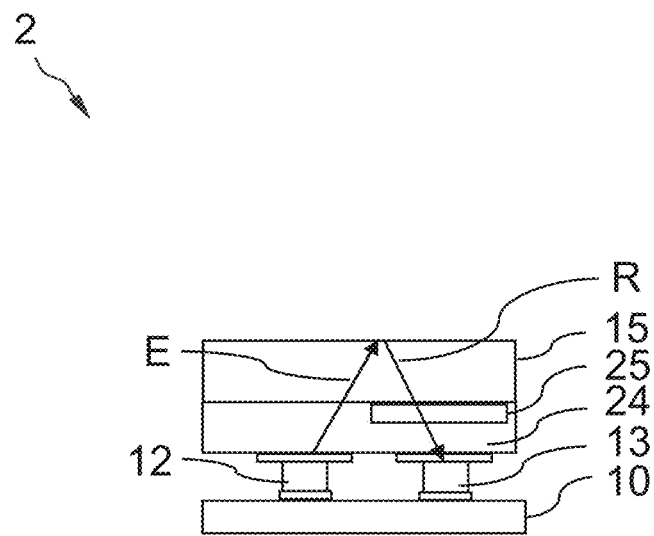
FIGS. 18 to 21 show exemplary embodiments of a sensing device according to the improved concept.

FIG. 18 shows a schematic cross-sectional view of an exemplary embodiment of an electronic sensing device 2 according to the improved concept. For example, the electronic sensing device 2 comprises a display 1 according to the improved concept. Features and functions of such a display 1 have already been described above.

The sensing device 2 comprises a micro light emitter, e.g. a micro-LED 12, which is configured to emit light for forming a display image on the display surface. The display surface is a top surface of the further substrate 15, which is a display glass, for instance. The sensing device 2 further comprises a micro photodetector, e.g. a micro photodiode 13, which is configured to detect light conditions at the display surface. In alternative embodiments, the micro photodetector can be a reverse-biased micro light emitter, e.g. a reverse-biased micro-LED. Also, in yet alternative embodiments, the micro light emitter can be an infrared emitter 14, such as VCSEL.

As illustrated, in this embodiment, emitted light E from the micro-LED 12 is reflected from the display surface and directed to the micro photodiode 13. An amount of the light that is reflected R to the micro photodiode 13 can be dependent on the interface, which is formed by the transition between the further substrate 15 and a medium surrounding the sensing device 2, which is air, for instance. For example, the light this reflected via total internal reflection. The reflected light R can be configured to pass through an optional filter element 25 before reaching the micro photodiode 13.

The electronic sensing device 2 further comprises a transceiver circuit, which is arranged on or within the display substrate 10, for instance. Besides for forming the display image, the transceiver circuit is configured to coordinate the micro light emitters and the micro photodetectors of the electronic sensing device 2 as a transceiver, for instance. That means that the transceiver drives at least a portion of the micro light emitters, e.g. infrared emitters, to emit light during an illumination phase and to drive the micro photodetectors to detect light during a subsequent sensing phase.

Moreover, the transceiver circuit comprises circuitry for processing the photo signals according to at least one of a list of sensing modes. For example, the transceiver circuit of the sensing device 2 shown in FIG. 18 is configured to detect whether the amount of the reflected light R varies of fluctuates, e.g. whether it is reduced.

Figure 19:
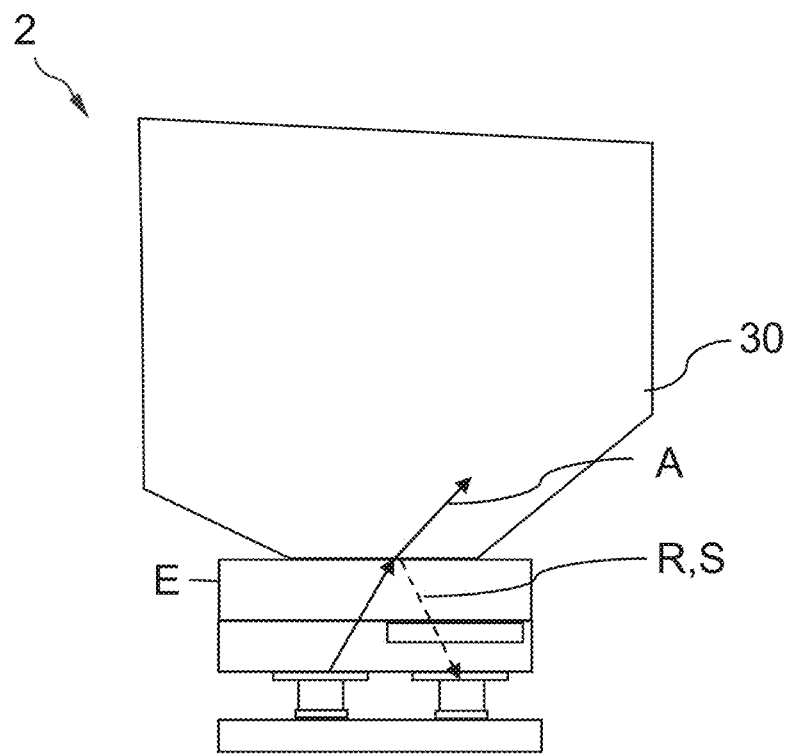

FIG. 19 shows a schematic cross-sectional view of the exemplary embodiment of the electronic sensing device 2 of FIG. 18 in case an object, such as a body part 30, is arranged on or above the display surface. For example, the body part 30 is a finger with a fingerprint that is in contact with the further substrate 15.

The body part 30 being placed in contact with the further substrate 15 means that the interface at which light is reflected is no longer formed by a transition between the further substrate 15 and air, but instead by a transition between the further substrate 15 and the body part 30. Due to the different refractive index of tissue, for instance, compared to air, the condition for total internal reflection at the interface is no longer fulfilled. This leads to the fact, but at least a portion of the emitted light E passes through the interface and is absorbed by the body part 30. The absorption is illustrated by means of the arrow labeled A. As a consequence, the amount of reflected light R in combination with scattered light S that is directed to the micro photodetector is reduced compared to the case of FIG. 18, in which no body part 30 is present.

Evaluating the amount of reflected light across the active region of the display 1 can be used to determine the fingerprint of a finger that is characterized by grooves with parts that are in contact with the further substrate 15 as well as parts, in which some amount of air remains between the body part 30 and the further substrate 15, for instance.

Alternative to the embodiment shown in FIGS. 18 and 19, likewise embodiments of the sensing device 2 are conceivable, in which the light emitters are arranged in such a manner, that substantially no light is reflected from the display surface to the micro photodetectors in case no body part is arranged on or above the display surface. To this end, the emitted light E can be approximately perpendicular to the display surface, for instance. Such embodiments allow to detect light that is reflected from objects, such as body parts 30, which are not necessarily in contact with the further substrate but positioned at a distance from the latter. These embodiments allow for facial or hand palm recognition as well as proximity sensing, for example, in cases in which the object is not brought into contact with the sensing device 2.

Figure 20:
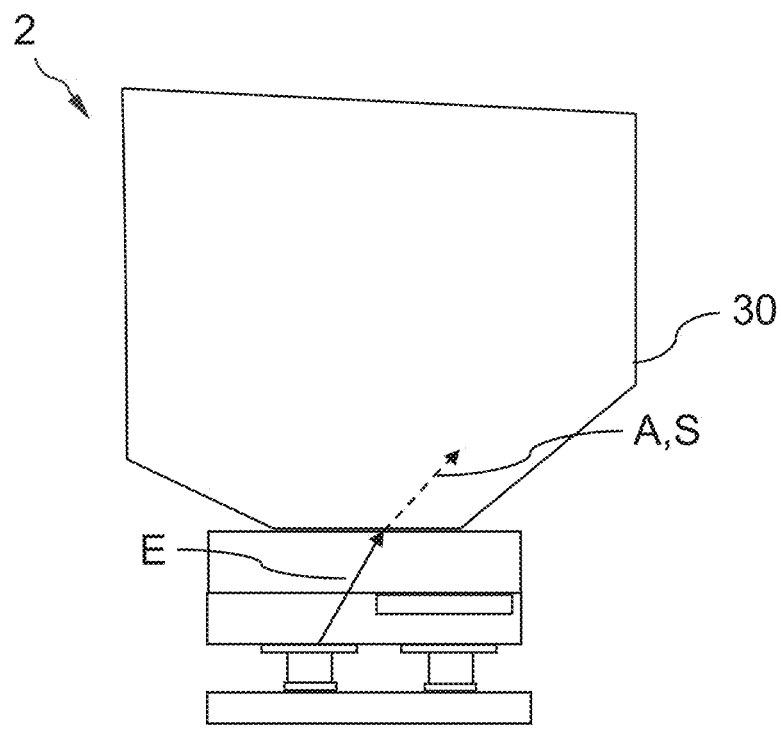

In further embodiments, such as in the embodiment of FIG. 20, the sensing device 2 can be configured in a manner that substantially no light is directed to the micro photodetectors if no object or an object without certain features, such as blood vessels or sweat channels, is positioned on the display surface. In these embodiments, the emitted light E is absorbed or scattered completely within the object, which may be a forged fingerprint, for instance.

Figure 21:
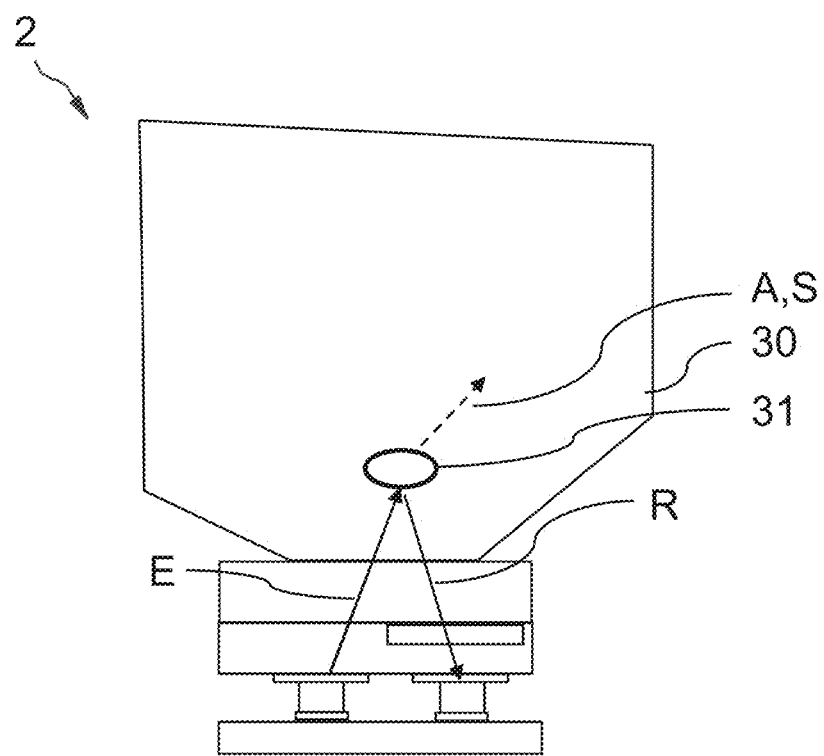

In FIG. 21, showing the same embodiment of the electronic sensing device 2 as in FIG. 20, the body part 30 located on the display surface comprises a channel 31, which can be a blood vessel structure or a sweat channel. Due to different refractive indices of the body part 30 itself and the channel 31, the emitted light E can be configured to be reflected at this interface and be directed towards the micro photodetector. These embodiments allow, besides for biometric authentication of a fingerprint, for the verification whether a live finger is to be authenticated. Likewise, a structure of the channels 31 can serve as additional biometric features measured and evaluated for the authentication purpose.

Particularly in these embodiments, in illumination with infrared light is advantageous as this is capable of penetrating human tissue, for instance. Therefore, the micro photodetectors are arranged in a manner such that light emitted from infrared emitters and is reflected from said channels 31 can be detected.

Also this embodiment is easily conceivable for detecting objects that are not necessarily in contact with the display surface but located at a distance from the latter. For example, facial or hand palm recognition can likewise be performed in this manner.

Exact methods to analyze the photo signals and to perform authentication processes and performing proximity detection is a well-known concept and thus not further detailed in this disclosure.

It is further pointed out that the embodiments of a sensing device 2 shown can further be used for ambient light sensing as well as for a solar cell mode, in which photo signals generated by the micro photodetectors are supplied to components of the sensing device 2 as an additional power supply realizing a battery support.

The embodiments of the display and the sensing device disclosed herein have been discussed for the purpose of familiarizing the reader with novel aspects of the idea. Although preferred embodiments have been shown and described, many changes, modifications, equivalents and substitutions of the disclosed concepts may be made by one having skill in the art without unnecessarily departing from the scope of the claims.

In particular, the disclosure is not limited to the disclosed embodiments, and gives examples of many alternatives as possible for the features included in the embodiments discussed. However, it is intended that any modifications, equivalents and substitutions of the disclosed concepts be included within the scope of the claims which are appended hereto.

Features recited in separate dependent claims may be advantageously combined. Moreover, reference signs used in the claims are not limited to be construed as limiting the scope of the claims.

Furthermore, as used herein, the term "comprising" does not exclude other elements. In addition, as used herein, the article "a" is intended to include one or more than one component or element, and is not limited to be construed as meaning only one.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred.

The invention claimed is:

1. An electronic sensing device comprising:
  a display having a display surface and a plurality of micro light emitters configured to emit light for forming a display image on the display surface;
  a plurality of micro photodetectors configured to detect light conditions at the display surface, wherein the plurality of micro photodetectors are reverse-biased micro light emitters; and
  a transceiver circuit configured to drive the micro light emitters to emit light;
drive the micro photodetectors to detect light and generate photo signals based on the detected light;
coordinate the driving of the micro light emitters and of the micro photodetectors; and
process the photo signals according to a list of sensing modes comprising a biometric authentication mode, a proximity sensing mode, an ambient light sensing mode, and a battery support mode;
wherein the plurality of micro light emitters and the plurality of micro photodetectors are arranged on a surface of a display substrate.

2. The electronic sensing device according to claim 1, wherein in the biometric authentication mode and in the proximity sensing mode, the plurality of micro photodetectors is configured to sense light that is emitted by at least a portion of the micro light emitters and is reflected from an interface that is defined by a user's body part located on or above the display surface.

3. The electronic sensing device according to claim 2, wherein the user's body part is a face, a palm of a hand or a finger.

4. The electronic sensing device according to claim 2, wherein the interface is defined by a blood vessel structure and/or by a sweat channel structure of the body part.

5. The electronic sensing device according to claim 2, wherein in the biometric authentication mode, the controller for processing the photo signals is configured to perform a biometric authentication, in particular fingerprint or facial recognition, of the body part based on the photo signals and on reference biometric data stored in a memory of the electronic sensing device.

6. The electronic sensing device according to claim 2, wherein in the proximity sensing mode, the controller for processing the photo signals is configured to determine a distance from the interface.

7. The electronic sensing device according to claim 1, wherein in the ambient light sensing mode and in the solar cell mode, the plurality of micro photodetectors is configured to sense light emitted in an environment of the electronic sensing device.

8. The electronic sensing device according to claim 7, wherein in the ambient light sensing mode, the controller for processing the photo signals is configured to determine characteristics of the light emitted in the environment, in particular brightness and/or spectral composition.

9. The electronic sensing device according to claim 7, wherein in the battery support mode, the controller for processing the photo signals is configured to provide at least a portion of the photo signals to the electronic sensing device as a power source.

10. The electronic sensing device according to claim 1, wherein the plurality of micro light emitters comprises micro infrared emitters such as infrared micro-LEDs or vertical-cavity surface-emitting lasers, VCSELs.

11. The electronic sensing device according to claim 1, wherein a footprint of the micro light emitters amounts to 80%-120% of the footprint of the micro photodetectors.

12. The electronic sensing device according to claim 1, wherein a footprint of the micro light emitters and of the micro photodetectors is smaller than 0.1 mm$^2$, in particular smaller than 100 µm$^2$.

13. A sensing method using a sensing device with a display having a display surface and a display substrate, the method comprising:
emitting light by means of a plurality of micro light emitters arranged on a surface of the display substrate for forming a display image on the display surface;
sensing light conditions at the display surface by means of a plurality of micro photodetectors arranged on the surface of the display substrate, wherein the plurality of micro photodetectors are reverse-biased micro light emitters;
reading out by means of a transceiver circuit photo signals generated by the micro photodetectors based on sensed light;
coordinating by means of the transceiver circuit driving of the micro light emitters and of the micro photodetectors; and
processing the photo signals according to a list of sensing modes comprising a biometric authentication mode, a proximity sensing mode, an ambient light sensing mode, and a battery support mode.

14. The method according to claim 13, wherein sensing light conditions at the display surface comprises detecting light from the micro light emitters via reflection from the display surface, in particular via total internal reflection.

15. The method according to claim 13, wherein sensing light conditions at the display surface comprises detecting light that is emitted in an environment of the electronic sensing device.

16. An electronic sensing device comprising:
a display having a display surface and a plurality of micro light emitters configured to emit light for forming a display image on the display surface;
a plurality of micro photodetectors configured to detect light conditions at the display surface, wherein the plurality of micro photodetectors are reverse-biased micro light emitters; and
a transceiver circuit configured to
drive the micro light emitters to emit light;
drive the micro photodetectors to detect light and generate photo signals based on the detected light;
coordinate the driving of the micro light emitters and of the micro photodetectors; and
process the photo signals according to at least one of a list of sensing modes;
wherein the plurality of micro light emitters and the plurality of micro photodetectors are arranged on a surface of a display substrate,
a further substrate is arranged on a side of the micro light emitters and of the micro photodetectors facing away from the display substrate, and
the plurality of micro light emitters and the plurality of micro photodetectors are electrically contacted by solder pads on the display substrate and by transparent conductors on the further substrate.

* * * * *